United States Patent
Kanamaru et al.

(10) Patent No.: US 8,815,400 B2
(45) Date of Patent: Aug. 26, 2014

(54) EPOXY RESIN COMPOSITION, DIE ATTACH METHOD USING SAME, AND SEMICONDUCTOR DEVICE CONTAINING CURED PRODUCT THEREOF

(75) Inventors: Tatsuya Kanamaru, Kitasaku-gun (JP); Shinsuke Yamaguchi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 316 days.

(21) Appl. No.: 13/351,484

(22) Filed: Jan. 17, 2012

(65) Prior Publication Data

US 2012/0193817 A1    Aug. 2, 2012

(30) Foreign Application Priority Data

Jan. 31, 2011    (JP) ................................. 2011-017398

(51) Int. Cl.
| | |
|---|---|
| *B32B 27/38* | (2006.01) |
| *H01L 23/14* | (2006.01) |
| *H01L 21/78* | (2006.01) |
| *C09J 163/00* | (2006.01) |
| *C08G 59/24* | (2006.01) |
| *C08G 59/30* | (2006.01) |
| *C08G 59/32* | (2006.01) |
| *C08G 59/62* | (2006.01) |
| *C08L 63/00* | (2006.01) |
| *H01L 23/00* | (2006.01) |
| *H01L 23/29* | (2006.01) |
| *C08K 5/103* | (2006.01) |
| *C08K 5/5419* | (2006.01) |

(52) U.S. Cl.
CPC ............ *H01L 23/296* (2013.01); *C08G 59/621* (2013.01); *C08L 63/00* (2013.01); *C08K 5/103* (2013.01); *C08K 5/5419* (2013.01); *H01L 24/29* (2013.01)
USPC ........... 428/413; 156/329; 156/330; 257/783; 428/448; 438/455; 438/458; 523/435; 523/440; 525/474; 525/476; 525/477; 525/478; 525/523; 525/529; 525/534

(58) Field of Classification Search
None
See application file for complete search history.

(56) References Cited

FOREIGN PATENT DOCUMENTS

| | | | |
|---|---|---|---|
| JP | 62209126 A | * 9/1987 | ............. C08G 59/62 |
| JP | 5-226571 | 9/1993 | |
| JP | 2005-60417 | 3/2005 | |

OTHER PUBLICATIONS

Translation of JP 62209126 A, provided by the USPTO translations department (no date).*

* cited by examiner

*Primary Examiner* — Michael J Feely
(74) *Attorney, Agent, or Firm* — Oblon, Spivak, McClelland, Maier & Neustadt, L.L.P.

(57) ABSTRACT

An epoxy resin composition including (A) an epoxy resin that is solid at room temperature and has a softening point of 40° C. to 110° C., (B) a curing agent that is solid at room temperature and has a softening point of not less than 40° C. to 110° C., (C) a curing accelerator, (D) an inorganic filler having a mass-average particle size of 0.05 to 5 μm, (E) a diluent, and (F) a specific dimethyl silicone, in which at least one of the component (A) and the component (B) is silicone-modified is provided. The composition can be used in a silicon chip die attach method or to produce a semiconductor device containing a silicon chip, a substrate and a cured product of the composition, in which the silicon chip is bonded to the substrate via the cured product.

13 Claims, No Drawings

EPOXY RESIN COMPOSITION, DIE ATTACH METHOD USING SAME, AND SEMICONDUCTOR DEVICE CONTAINING CURED PRODUCT THEREOF

BACKGROUND OF THE INVENTION

1. Field of the Invention

The present invention relates to an epoxy resin composition that can be used favorably for bonding semiconductor chips and semiconductor elements. More specifically, the invention relates to an epoxy resin composition that exhibits excellent thin-film printability and forms a stable B-stage state, as well as a die attach method that uses the composition and a semiconductor device containing a cured product of the composition.

2. Description of the Prior Art

Epoxy resins exhibit excellent adhesiveness and heat resistance and the like, and are therefore used in all manner of applications. In particular, liquid epoxy resins are widely used in the production of electrical and electronic componentry. Examples of methods that may be used for applying a liquid epoxy resin or a composition comprising a liquid epoxy resin as a main ingredient to a component include spin coating, printing and dipping methods. Of these methods, printing enables coating films of all manner of shapes to be formed easily and with good productivity, and is therefore widely used.

One example of a known screen printing composition containing an epoxy resin is an adhesive varnish comprising a polyimide silicone resin (A), an epoxy resin (B), an epoxy resin curing agent (C), an inorganic filler (D) and an organic solvent (E) (see Patent Document 1). Further, a lead frame-affixing composition comprising an epoxy resin, a photopolymerization initiator, a thermoplastic elastomer prepolymer for imparting the B-stage state and the cured state with superior toughness, a filler for improving the thixotropic properties, and a solvent is also known (see Patent Document 2). These compositions are applied to narrow areas such as a lead frame. Moreover, in recent years, there have been strong demands for reductions in the thickness and size of semiconductor packages. Die bonding materials are no exception, and materials having a thickness of 10 μm or less are now being sought.

[Patent Document 1] JP 2005-60417 A
[Patent Document 2] JP 05-226571 A

SUMMARY OF THE INVENTION

If the above-mentioned compositions are printed across a larger surface area, such as the entire surface of a large-diameter silicon wafer, then irregularities are formed on the surface, and forming a film of uniform thickness is difficult.

Accordingly, an object of the present invention is to provide an epoxy resin composition which can be applied to a silicon wafer using a printing method, with a thickness of several μm to several dozen μm and with good suppression of surface irregularities, can be easily B-staged by heating, and in the B-stage state, exhibits excellent bonding to dicing tapes and superior dicing properties when dicing the silicon wafer to form individual chips.

As a result of intensive investigation aimed at addressing the issues described above, the inventors of the present invention discovered that a resin composition comprising an epoxy resin and a curing agent having specific softening points and a dimethyl silicone oil exhibited excellent smoothness following printing, and in a B-stage state, exhibited excellent bonding to dicing tapes and superior dicing properties when dicing a silicon wafer to form individual chips, and they were therefore able to complete the present invention.

In other words, a first aspect of the present invention provides an epoxy resin composition comprising:

(A) an epoxy resin that is solid at room temperature and has a softening point of not less than 40° C. and not more than 110° C., (B) a curing agent that is solid at room temperature and has a softening point of not less than 40° C. and not more than 110° C., in an amount that provides, within the component (B), 0.8 to 1.25 equivalents of groups that exhibit reactivity with an epoxy group, per 1 equivalent of epoxy groups within the component (A), (C) a curing accelerator, in an amount of 0.05 to 10 parts by mass per 100 parts by mass of the combination of the component (A) and the component (B), (D) an inorganic filler having a mass-average particle size of 0.05 to 5 μm, in an amount of 5 to 200 parts by mass per 100 parts by mass of the combination of the component (A) and the component (B), (E) a diluent, in an amount of 5 to 400 parts by mass per 100 parts by mass of the combination of the component (A) and the component (B), and (F) a dimethyl silicone represented by general formula (I) shown below, in an amount of 0.01 to 2 parts by mass per 100 parts by mass of the combination of the component (A) and the component (B):

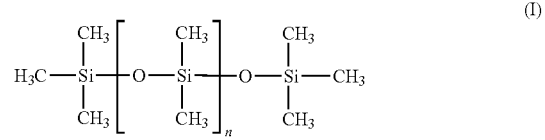

(wherein n represents an integer of 0 to 2,000), wherein at least one of the component (A) and the component (B) is silicone-modified.

A second aspect of the present invention provides a silicon chip die attach method comprising steps (i) to (vi) below:

(i) applying the epoxy resin composition described above to one surface of a silicon wafer to form an adhesive layer comprising the epoxy resin composition, (ii) performing heating at 60° C. to 200° C. for a period of 1 minute to 3 hours, thereby B-staging the epoxy resin composition within the adhesive layer, (iii) bonding the silicon wafer to a dicing tape via the adhesive layer comprising the B-staged epoxy resin composition, (iv) cutting the adhesive layer and the silicon wafer of step (iii), thereby obtaining a plurality of individual chips, each comprising the cut adhesive layer and a silicon chip formed from the cut silicon wafer, and having the adhesive layer bonded to one surface of the silicon chip, (v) picking up the individual chip from the dicing tape, and mounting the individual chip to a substrate via the epoxy resin composition of the individual chip, and (vi) curing the epoxy resin composition of the individual chip mounted on the substrate.

A third aspect of the present invention provides a semiconductor device comprising a silicon chip, a substrate and a cured product of the epoxy resin composition described above, wherein the silicon chip is bonded to the substrate via the cured product.

The epoxy resin composition of the present invention exhibits excellent smoothness following printing, and can therefore be applied to a silicon wafer by screen printing with a thickness of several μm to several dozen μm and with good suppression of surface irregularities, and can then be easily converted to a B-stage state by heating. Moreover, in the B-stage state, the resin composition exhibits excellent bonding to dicing tapes and superior dicing properties when dicing the silicon wafer to form individual chips. Furthermore, the epoxy resin composition of the present invention has low elasticity, and therefore exhibits excellent resistance to thermal cycling, and can be used favorably as a die bonding material within a method in which the dicing step is conducted with the composition in a B-stage state.

DETAILED DESCRIPTION OF THE PREFERRED EMBODIMENTS

The present invention is described below in further detail. In this description, the term "B-stage state" describes the state in which the epoxy resin composition has undergone primary curing and exists in a semi-cured or provisionally cured state, whereas the term "C-stage state" describes the state once the curing reaction has completely finished. Further, the expression "B-staging" describes the process of converting the composition to the B-stage state. The "weight-average molecular weight" refers to the polystyrene-equivalent weight-average molecular weight measured using gel permeation chromatography (GPC). Moreover, "room temperature" typically describes a temperature within a range from 5 to 35° C., and particularly from 17 to 28° C.

[(A) Epoxy Resin]

The epoxy resin of the component (A) is a solid at room temperature, and has a softening point that is typically not less than 40° C. and not more than 110° C., preferably not less than 45° C. and not more than 100° C., and more preferably not less than 50° C. and not more than 90° C. This ensures that, during dicing, the silicon wafer remains affixed securely to the dicing tape, enabling chip breakage and chip flying to be prevented. If the softening point is less than the lower limit of the above range, then the adhesion between the dicing tape and the silicon wafer becomes too strong, meaning pickup of the chips becomes difficult, which can lead to chip breakage. In contrast, if the softening point exceeds the above upper limit, then during die attachment following pickup of the chip, the viscosity of the resin composition is too high, increasing the possibility of unsatisfactory bonding to the substrate. The softening point of the epoxy resin is determined using the ring and ball method prescribed in JIS K 7234. The component (A) may be either a single resin or a combination of two or more different resins.

There are no particular limitations on the epoxy resin, provided it has a softening point described above, and examples of resins that may be used include novolac epoxy resins, bisphenol epoxy resins, biphenyl epoxy resins, phenol aralkyl epoxy resins, dicyclopentadiene epoxy resins, naphthalene epoxy resins and amino group-containing epoxy resins, as well as the silicone-modified epoxy resins described below and mixtures of the above resins. Among these resins, bisphenol A epoxy resins, bisphenol F epoxy resins, novolac epoxy resins and silicone-modified epoxy resins are preferred.

A silicone-modified epoxy resin is a copolymer obtained by reacting an alkenyl group-containing epoxy resin and an organohydrogenpolysiloxane. Examples of the alkenyl group-containing epoxy resin include compounds of the formulas (1) to (3) shown below.

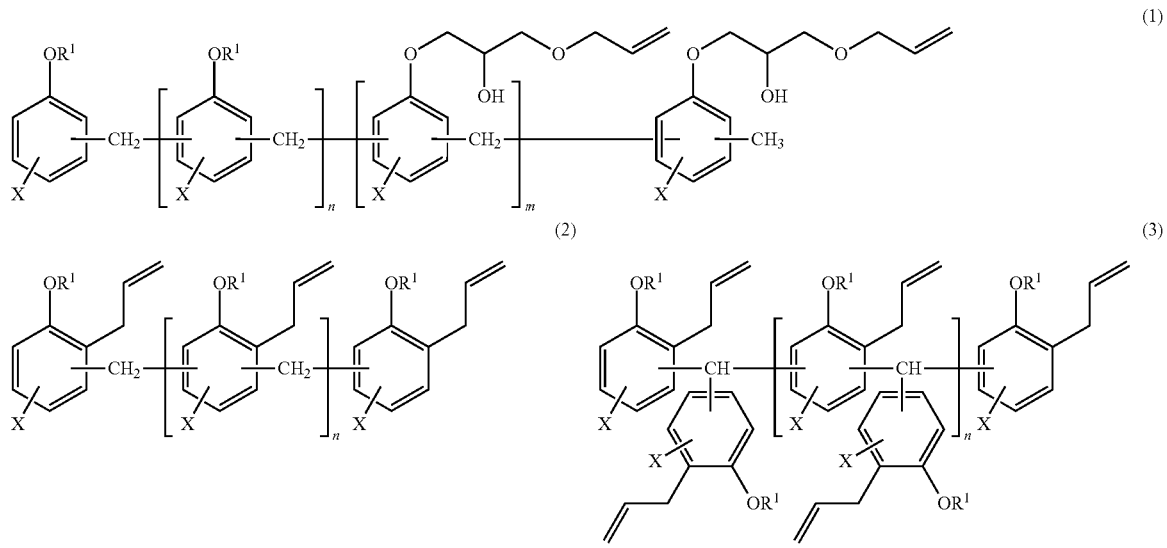

In formulas (1) to (3) above, $R^1$ represents a glycidyl group represented by the formula shown below.

Each X independently represents a hydrogen atom or a bromine atom, and n represents an integer of 0 or greater, preferably an integer of 0 to 50, and more preferably an integer of 1 to 20. m represents an integer of 1 or greater, preferably an integer of 1 to 5, and most preferably 1. However, in order to ensure that the silicone-modified epoxy resin is solid at room temperature, the value of m/(m+n) is preferably within a range from 0.01 to 0.5, and more preferably from 0.02 to 0.2.

Examples of the organohydrogenpolysiloxane include compounds represented by an average composition formula (4) shown below.

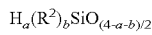

(4)

In formula (4), each $R^2$ independently represents a hydroxyl group, an unsubstituted or substituted monovalent hydrocarbon group of 1 to 10 carbon atoms, an unsubstituted or substituted alkoxy group of 1 to 10 carbon atoms, or an unsubstituted or substituted alkenyloxy group of 1 to 10 carbon atoms. Specific examples of the monovalent hydrocarbon groups include alkyl groups such as a methyl group, ethyl group, n-propyl group, isopropyl group, n-butyl group, isobutyl group, tert-butyl group, pentyl group, neopentyl group, hexyl group, cyclohexyl group, octyl group or decyl group, alkenyl groups such as a vinyl group, allyl group, propenyl group or butenyl group, aryl groups such as a phenyl group or tolyl group, aralkyl groups such as a benzyl group or phenylethyl group, and halogenated monovalent hydrocarbon groups in which some or all of the hydrogen atoms within the above hydrocarbon groups have each been substituted with a halogen atom. Examples of the substituted alkoxy groups include halogen-substituted alkoxy groups, and examples of the substituted alkenyloxy groups include halogen-substituted alkenyloxy groups.

a and b are numbers that satisfy $0.001 \leq a \leq 1$, $1 \leq b \leq 3$ and $1 < a+b \leq 4$, and are preferably numbers that satisfy $0.01 \leq a \leq 0.1$, $1.8 \leq b \leq 2$ and $1.85 \leq a+b \leq 2.1$. The organohydrogenpolysiloxane preferably contains 1 to 1,000 silicon atoms, more preferably 2 to 400 silicon atoms, and still more preferably 5 to 200 silicon atoms, per molecule. Examples of such organohydrogenpolysiloxanes include compounds represented by formula (5) shown below.

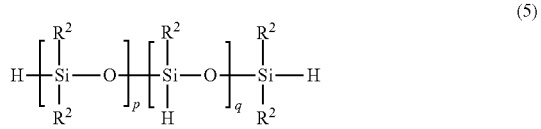

(5)

In formula (5), $R^2$ is the same as defined above, and is preferably a methyl group or a phenyl group. p represents an integer of 0 to 1,000 and preferably an integer of 3 to 400, and q represents an integer of 0 to 20 and preferably an integer of 0 to 5, provided that $1 \leq p+q \leq 1,000$, preferably $2 \leq p+q \leq 400$, and more preferably $5 \leq p+q \leq 200$.

Specific examples of this type of organohydrogenpolysiloxane include the compounds shown below.

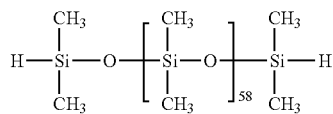

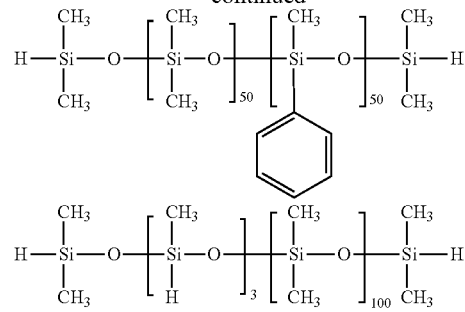

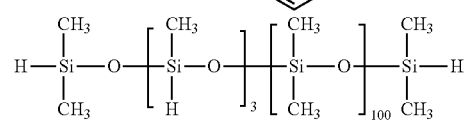

The molecular weight of the organohydrogenpolysiloxane is preferably within a range from 100 to 100,000, and more preferably from 500 to 20,000. If the molecular weight of the organohydrogenpolysiloxane satisfies the above range, then depending on the structure and/or the molecular weight of the alkenyl group-containing epoxy resin reacted with the organohydrogenpolysiloxane, a uniform structure in which the organohydrogenpolysiloxane is dispersed uniformly within the matrix, or an islands-in-sea structure in which the organohydrogenpolysiloxane forms minute layer separation within the matrix can be realized.

When the molecular weight of the organohydrogenpolysiloxane is comparatively small, and particularly when the molecular weight is within a range from 100 to 10,000, a uniform structure tends to be formed, whereas when the molecular weight of the organohydrogenpolysiloxane is comparatively large, and particularly when the molecular weight is within a range from 10,000 to 100,000, an islands-in-sea structure tends to be formed. The selection of a uniform structure or an islands-in-sea structure may be made in accordance with the intended application. If the molecular weight of the organohydrogenpolysiloxane is less than 100, then the resulting cured product becomes rigid and brittle. Further, if the molecular weight of the organohydrogenpolysiloxane exceeds 100,000, then the islands-in-sea structure becomes too large, and the resulting cured product tends to suffer from localized stress.

A conventional method may be used for reacting the alkenyl group-containing epoxy resin and the organohydrogenpolysiloxane, and for example, the silicone-modified epoxy resin may be produced by subjecting the alkenyl group-containing epoxy resin and the organohydrogenpolysiloxane to an addition reaction in the presence of a platinum-based catalyst. The amount of the organohydrogenpolysiloxane is preferably adjusted so that the copolymerization reaction is conducted under conditions in which the amount of SiH groups within the organohydrogenpolysiloxane is within a range from 0.1 to 1 mol per 1 mol of alkenyl groups within the alkenyl group-containing epoxy resin.

[(B) Curing Agent]

The curing agent of the component (B) is solid at room temperature, and has a softening point that is typically not less than 40° C. and not more than 110° C., preferably not less than 45° C. and not more than 100° C., and more preferably not less than 50° C. and not more than 90° C. This ensures that, during dicing, the silicon wafer remains affixed securely to the dicing tape, enabling chip breakage and chip flying to be prevented. If the softening point is less than the lower limit of the above range, then the adhesion between the dicing tape and the silicon wafer becomes too strong, meaning pickup of the chips becomes difficult, which can lead to chip breakage. In contrast, if the softening point exceeds the above upper limit, then during die attachment following pickup of the chip, the viscosity of the resin composition is too high, increasing the possibility of unsatisfactory bonding to the substrate. The softening point of the curing agent is determined using the ring and ball method prescribed in JIS K 7234. The component (B) may be either a single compound or a combination of two or more different compounds.

Conventional compounds that are typically used as curing agents for epoxy resins may be used as the curing agent of the component (B), provided the curing agent has a softening point that satisfies the range described above. Examples include phenolic resins (namely, unmodified phenolic resins), silicone-modified phenolic resins, acid anhydrides and amines. Among these compounds, the use of a phenolic resin or a silicone-modified phenolic resin is preferred. Examples of the phenolic resins include aralkyl phenolic resins, novolac phenolic resins, bisphenol phenolic resins, trishydroxyphenylmethane phenolic resins, naphthalene phenolic resins, cyclopentadiene phenolic resins and phenol aralkyl phenolic resins, and these resins may be used individually or in mixtures containing two or more resins. Among these resins, aralkyl phenolic resins, novolac phenolic resins and bisphenol phenolic resins are preferred.

A silicone-modified phenolic resin is a copolymer obtained by reacting an organohydrogenpolysiloxane and an alkenyl group-containing phenolic resin. Examples of silicone-modified phenolic resins include copolymers obtained by reacting an organohydrogenpolysiloxane represented by the above formula (4) and an alkenyl group-containing phenolic resin shown below. A conventional method may be used for the reaction. For example, the silicone-modified phenolic resin may be produced by subjecting the alkenyl group-containing phenolic resin and the organohydrogenpolysiloxane to an addition reaction in the presence of a platinum-based catalyst. The amount of the organohydrogenpolysiloxane is preferably adjusted so that the copolymerization reaction is conducted under conditions in which the amount of SiH groups within the organohydrogenpolysiloxane is within a range from 0.1 to 1 mol per 1 mol of alkenyl groups within the alkenyl group-containing phenolic resin.

Examples of the alkenyl group-containing phenolic resin include the compounds shown below.

The component (B) is added in an amount that provides, within the component (B), 0.8 to 1.25 equivalents, and preferably 0.9 to 1.1 equivalents, of groups that exhibit reactivity with an epoxy group, per 1 equivalent of epoxy groups within the component (A). If the amount added of the component (B) falls outside this range, then a portion of the resin composition tends to remain uncured, which can have adverse effects on the performance of the cured product and the performance of the semiconductor device.

In the epoxy resin composition of the present invention, at least one of the component (A) and the component (B) is a silicone-modified component, and both components may be silicone-modified. Compositions in which at least the component (A) is a silicone-modified component are particularly desirable. When the component (B) is not silicone-modified, the component (A) is a silicone-modified epoxy resin. By including silicone chains within the epoxy resin composition, a cured product with low elasticity and excellent resistance to thermal cycling can be obtained.

[(C) Curing Accelerator]

There are no particular limitations on the curing accelerator, provided it accelerates the reaction between the epoxy resin (A) and the curing agent (B). A single compound may be used as the component (C), or two or more compounds may be used in combination. Examples of compounds that may be used as the component (C) include basic organic compounds such as organophosphorus compounds, imidazoles and tertiary amines. Specific examples of the organophosphorus compounds include triphenylphosphine, tributylphosphine, tri(p-toluyl)phosphine, tri(p-methoxyphenyl)phosphine, tri(p-ethoxyphenyl)phosphine, triphenylphosphine-triphenylborate derivatives, and tetraphenylphosphine-tetraphenylborate derivatives. Specific examples of the imidazoles include 2-methylimidazole, 2-ethylimidazole, 2-ethyl-4-methylimidazole, 2-phenylimidazole, 2-phenyl-4-methylimidazole, 2-phenyl-4-methyl-5-hydroxymethylimidazole, and 2-phenyl-4,5-dihydroxymethylimidazole. Specific examples of the tertiary amines include triethylamine, benzyldimethylamine, α-methylbenzyldimethylamine, and 1,8-diazabicyclo[5.4.0]undecene-7.

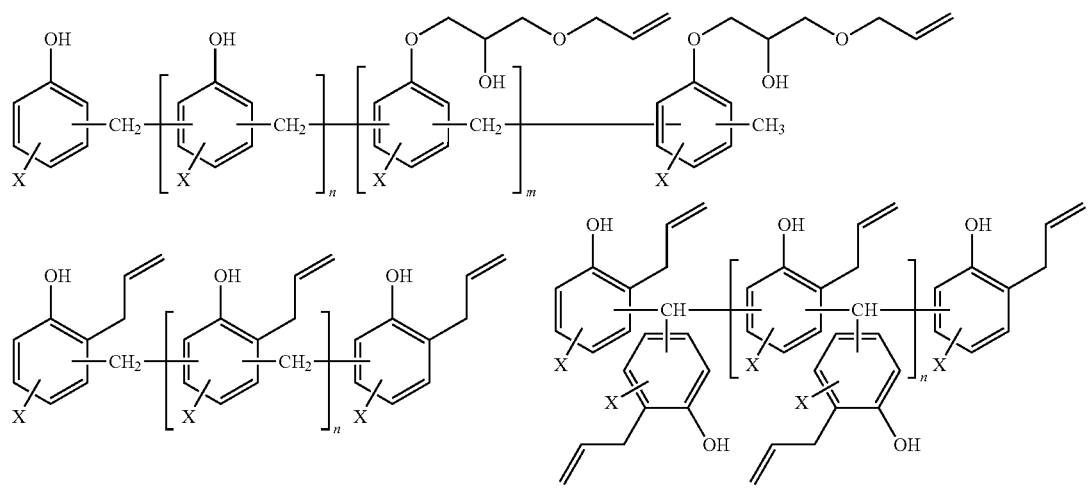

In the above formulas, X, n and m are the same as defined above.

Among these compounds, tetraphenylphosphine-tetraphenylborate derivatives represented by formula (6) shown below, and methylolimidazole derivatives represented by formula (7) shown below are preferred. The curing accelerator is preferably selected in combination with the curing agent (B).

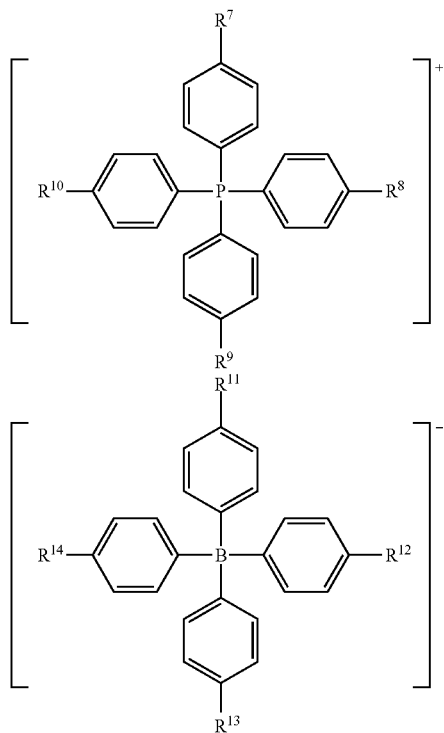

(6)

In formula (6), each of $R^7$ to $R^{14}$ independently represents a hydrogen atom, a monovalent hydrocarbon group of 1 to 10 carbon atoms, or a halogen atom.

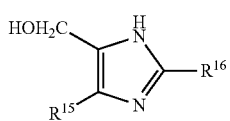

(7)

In formula (7), $R^{15}$ represents a methyl group or a methylol group, and $R^{16}$ represents a monovalent hydrocarbon group of 1 to 10 carbon atoms.

The amount added of the curing accelerator (C) is typically within a range from 0.05 to 10 parts by mass, preferably from 0.1 to 10 parts by mass, and more preferably from 0.2 to 5 parts by mass, per 100 parts by mass of the combination of the epoxy resin (A) and the curing agent (B). If the amount of the curing accelerator is less than the lower limit of the above range, then curing of the epoxy resin composition may not proceed satisfactorily, whereas an amount that exceeds the upper limit may have an adverse effect on the storage properties of the epoxy resin composition or the stability of the B-stage state.

[(D) Inorganic Filler Having a Mass-Average Particle Size of 0.05 to 5 µm]

The component (D) is an inorganic filler having a mass-average particle size of 0.05 to 5 µm. The component (D) may be a single such inorganic filler or a combination of two or more different inorganic fillers. Specific examples of the inorganic filler of the component (D) include fused silica, crystalline silica, alumina, titanium oxide, silica-titania, boron nitride, aluminum nitride, silicon nitride, magnesia, magnesium silicate, talc and mica. These inorganic fillers may be used individually or in mixtures containing two or more fillers. The use of one filler, or a combination of two or more fillers, selected from among silica, alumina and talc is preferred.

The mass-average particle size of the inorganic filler is typically within a range from 0.05 to 5 µm, and preferably from 0.5 to 3 µm. The mass-average particle size may be measured using a laser diffraction method, for example by measuring the cumulative mass average diameter $D_{50}$ (or the median diameter) or the like. If the mass-average particle size is less than the lower limit of the above range, then the viscosity of the resin composition increases, and the printability deteriorates. In contrast, if the mass-average particle size exceeds the upper limit, then the surface roughness of the B-stage state increases, meaning the adhesion to the dicing film deteriorates, increasing the possibility of chip flying or chip breakage during dicing.

The maximum particle size of the inorganic filler is preferably not more than 50%, and more preferably not more than 30%, of the thickness of the die bonding agent (typically 5 to 50 µm) applied to the wafer. Provided the maximum particle size satisfies this range, the inorganic filler of the component (D) can be effectively prevented from damaging the chip, the circuit board or the wiring or the like, and the occurrence of localized stress at the interfaces between the inorganic filler and other portions becomes less likely, meaning the functions of the semiconductor device can be more readily maintained.

Use of an inorganic filler that has been subjected to preliminary surface treatment with a silane coupling agent is preferable. A composition in which the epoxy resin of the component (A) and a filler that has been subjected to surface treatment with a coupling agent are subjected to a preliminary mixing treatment under reduced pressure is particularly desirable. This ensures that the interfaces between the surfaces of the filler and the epoxy resin are in a thoroughly wet state, which dramatically improves the moisture resistance reliability of the composition.

Specific examples of the above silane coupling agent include γ-glycidoxypropyltrimethoxysilane, γ-glycidoxypropylmethyldiethoxysilane, γ-glycidoxypropyltriethoxysilane, p-styryltrimethoxysilane, γ-methacryloyloxypropylmethyldimethoxysilane, γ-methacryloyloxypropyltrimethoxysilane, γ-methacryloyloxypropylmethyldiethoxysilane, γ-methacryloyloxypropyltriethoxysilane, γ-acryloyloxypropyltrimethoxysilane, N-β-(aminoethyl)-γ-aminopropylmethyldimethoxysilane, N-β-(aminoethyl)-γ-aminopropyltrimethoxysilane, N-β-(aminoethyl)-γ-aminopropyltriethoxysilane, γ-aminopropyltrimethoxysilane, γ-aminopropyltriethoxysilane, N-phenyl-γ-aminopropyltrimethoxysilane, γ-mercaptopropylmethyldimethoxysilane, γ-mercaptopropyltrimethoxysilane, bis(triethoxypropyl)tetrasulfide, and γ-isocyanatopropyltriethoxysilane. These compounds may be used individually, or in combinations containing two or more compounds. Among these silane coupling agents, the use of γ-glycidoxypropyltrimethoxysilane is preferred.

The amount added of the inorganic filler of the component (D) is typically within a range from 5 to 200 parts by mass, preferably from 7.5 to 150 parts by mass, and more preferably from 10 to 100 parts by mass, per 100 parts by mass of the combination of the epoxy resin (A) and the curing agent (B). If the amount of the inorganic filler is less than the lower limit of the above range, then the resin strength following curing tends to weaken, and failure is more likely in the moisture and solder resistance test, or the temperature cycling test described below. In contrast, if the amount of the inorganic filler exceeds the upper limit, then the viscosity during die attachment increases, and bonding the chip to a substrate may become problematic.

[(E) Diluent]

The diluent is added for the purpose of regulating the viscosity of the resin composition. The component (E) may be either a single compound or a combination of two or more different compounds.

Although there are no particular limitations on the variety of the diluent, a solvent (and particularly an organic solvent) having a boiling point of 150° C. or higher is preferred, and a solvent that is capable of dissolving a mixture of the component (A), the component (B) and the component (F), does not dissolve the component (C) and the component (D), and has a boiling point of 150° C. or higher is particularly desirable. Examples of such solvents include aromatic hydrocarbons such as toluene and xylene, ketones such as methyl isobutyl ketone, cyclohexanone, isophorone and diacetone alcohol, glycol ethers such as methyl cellosolve, ethyl cellosolve, butyl cellosolve, methyl carbitol, ethyl carbitol and butyl carbitol, and glycol esters such as methyl cellosolve acetate, ethyl cellosolve acetate and carbitol acetate. In order to adjust the viscosity of the resin composition to a viscosity that yields favorable workability during printing, the diluent preferably has a reasonably high boiling point, for example within a range from 180° C. to 260° C. Among the various possibilities, isophorone, ethyl carbitol, butyl carbitol, carbitol acetate, butyl carbitol acetate, dipropylene glycol dimethyl ether, dipropylene glycol n-propyl ether, dipropylene glycol n-butyl ether, dipropylene glycol methyl ether, tripropylene glycol methyl ether, dipropylene glycol methyl ether acetate, 1,3-butylene glycol diacetate and 1,6-hexanediol diacetate are preferred.

Although there are no particular limitations on the amount added of the diluent, the amount is typically within a range from 5 to 400 parts by mass, and preferably from 30 to 100 parts by mass, per 100 parts by mass of the combination of the epoxy resin (A) and the curing agent (B). If the amount of the diluent exceeds 400 parts by mass, then the viscosity of the resin composition becomes too low, increasing the possibility that the inorganic filler (D) may precipitate during long-term storage. In contrast, if the amount of the diluent is less than 5 parts by mass, then the viscosity of the resin composition tends to be too high, and application of the composition to the silicon wafer tends to become problematic.

[(F) Dimethyl Silicone]

The dimethyl silicone (namely, a linear dimethylpolysiloxane with both molecular chain terminals blocked with trimethylsiloxy groups) of the component (F) has a low surface tension, has an effect of rapidly leveling the remains of the mesh produced following screen printing, and also has an effect of defoaming voids following printing. The component (F) may be either a single dimethyl silicone or a combination of two or more such compounds.

The amount added of the dimethyl silicone is typically within a range from 0.01 to 2 parts by mass, and preferably from 0.1 to 1 part by mass, per 100 parts by mass of the combination of the epoxy resin (A) and the curing agent (B). If the amount of the dimethyl silicone exceeds 2 parts by mass, then because the compatibility with the component (A) and the component (B) is poor, the dimethyl silicone may separate from the composition. In contrast, if the amount of the dimethyl silicone is less than 0.01 parts by mass, then a satisfactory leveling effect and defoaming effect may be unobtainable.

The viscosity of the dimethyl silicone at 25° C. is preferably within a range from 1 mPa·s to 1,000,000 mPa·s, is more preferably from 10 mPa·s to 100,000 mPa·s, and is still more preferably from 50 mPa·s to 1,000 mPa·s. Provided the viscosity satisfies this range, the boiling point does not drop too low, meaning the dimethyl silicone is unlikely to volatilize during the production process, and the dispersibility is less likely to deteriorate, meaning a satisfactory leveling effect and defoaming effect are more readily achievable. The value of n in the above general formula (I) preferably determines the viscosity. Specifically, n is typically an integer within a range from 0 to 2,000, preferably from 10 to 1,500, and more preferably from 50 to 500.

[Other Components]

In addition to the components described above, the composition of the present invention may, depending on the intended application of the composition, also include other components, including insulating fillers such as silica, alumina, talc, mica, silicon nitride and boron nitride, silane coupling agents, flame retardants, ion trapping agents, waxes, colorants and adhesion assistants, provided the amounts of these other components does not impair the object of the present invention. These other components may be used individually, or in combinations containing two or more components.

Examples of the silane coupling agents include γ-glycidoxypropyltrimethoxysilane, γ-glycidoxypropylmethyldiethoxysilane, γ-glycidoxypropyltriethoxysilane, p-styryltrimethoxysilane, γ-methacryloyloxypropylmethyldimethoxysilane, γ-methacryloyloxypropyltrimethoxysilane, γ-methacryloyloxypropylmethyldiethoxysilane, γ-methacryloyloxypropyltriethoxysilane, γ-acryloyloxypropyltrimethoxysilane, N-β-(aminoethyl)-γ-aminopropylmethyldimethoxysilane, N-β-(aminoethyl)-γ-aminopropyltrimethoxysilane, N-β-(aminoethyl)-γ-aminopropyltriethoxysilane, γ-aminopropyltrimethoxysilane, γ-aminopropyltriethoxysilane, N-phenyl-γ-aminopropyltrimethoxysilane, γ-mercaptopropylmethyldimethoxysilane, γ-mercaptopropyltrimethoxysilane, bis(triethoxypropyl)tetrasulfide, and γ-isocyanatopropyltriethoxysilane. These compounds may be used individually, or in combinations containing two or more compounds. Among these silane coupling agents, the use of γ-glycidoxypropyltrimethoxysilane is preferred. The amount added of the silane coupling agent is preferably within a range from 0.1 to 5 parts by mass, and more preferably from 0.3 to 3 parts by mass, per 100 parts by mass of the combination of the components (A) to (F).

[Epoxy Resin Composition]

The epoxy resin composition of the present invention can be produced by mixing the above components by a conventional method, for example by using a mixer or a roll mill or the like. The epoxy resin composition of the present invention is preferably a composition which, at one thickness within a range from 5 μm to 200 μm, can be B-staged by heating the composition at 60° C. to 200° C., and preferably 80° C. to 150° C., for a period of 1 minute to 3 hours, and preferably 10 minutes to 1 hour. Further, in the B-stage state, the arithmetic mean roughness of the surface of the epoxy resin composition of the present invention is preferably not more than 2 μm (0 to 2 μm), and more preferably 1 μm or less. The arithmetic mean roughness is measured in accordance with JIS B 0601.

The viscosity of the epoxy resin composition of the present invention in the B-stage state, measured at 120° C. using an E-type viscometer, is typically within a range from 1 to 1,000 Pa·s, and preferably from 5 to 200 Pa·s. If this viscosity exceeds the upper limit of the above range, then the wetting properties of the epoxy resin composition and the adherend during die attachment tend to be poor, which can cause voids and bonding faults. If the viscosity is less than the lower limit, then the Si chip may not be completely secured during die attachment, meaning there is a possibility of the chip moving. The viscosity measurement using the E-type viscometer is conducted in accordance with JIS Z-8803.

[Silicon Chip Die Attach Method]

The epoxy resin composition of the present invention can be used in a silicon chip die attach method comprising the steps (i) to (vi) described above.

In step (i), using a conventional method with a screen mask, the epoxy resin composition is applied to one surface of a silicon wafer using a printing method. The surface to which the epoxy resin composition has been applied is subsequently bonded to a substrate such as a circuit board or a chip in step (v) described below.

In step (ii), heating is performed in an closeable oven or a continuous oven at a temperature of 60° C. to 200° C., and preferably a temperature of 80° C. to 150° C., for a period of 1 minute to 3 hours, and preferably 10 minutes to 1 hour, thereby converting the epoxy resin composition to a B-stage state.

Step (iii) may be conducted using a conventional method.

In step (iv), the silicon wafer and the adhesive layer comprising the epoxy resin composition are cut into a plurality of individual chips, each of which retains the bond between the wafer and the adhesive layer, by a dicing method in which the silicon wafer is cut using a diamond blade rotating at high speed, or a laser dicing method that uses a laser. The method used for performing the cutting may be selected in accordance with the intended application.

In step (v), for example, a die bonder is used to mount an individual chip on a substrate such as a circuit board or another chip. There are no particular limitations on the conditions used for mounting the individual chip, and these conditions may be selected in accordance with the intended application. Examples of these mounting conditions include the temperature and the length of time of the preheating performed immediately prior to mounting of the individual chip, and the temperature, time and pressure of the chip and the substrate during the mounting process. The preheating is performed to improve the adhesion between the individual chip and the epoxy resin composition applied to the chip. The preheating is preferably performed at a temperature of 50° C. to 150° C. for a period of 2 seconds to 10 minutes. Preferred mounting conditions for the individual chip include a temperature for the individual chip of 25° C. to 250° C., a substrate temperature of 25° C. to 200° C., a bonding time of 0.1 seconds to 10 seconds, and a mounting pressure of 0.01 MPa to 10 MPa.

In step (vi), the epoxy resin composition is cured using a closeable oven or a continuous oven. The curing conditions preferably include a temperature of 100° C. to 200° C., and more preferably 120° C. to 180° C., and a heating time of 1 to 8 hours, and more preferably 1.5 to 3 hours. Curing of the epoxy resin composition may be conducted simultaneously with resin encapsulation of the semiconductor device.

[Semiconductor Device]

An example of the silicon chip in the semiconductor device of the present invention is a silicon chip obtained by cutting the silicon wafer in the above step (iv). Further, an example of the substrate in the semiconductor device of the present invention is the circuit board or other chip on which the individual chip is mounted in the above step (v). Moreover, an example of the cured product in the semiconductor device of the present invention is the cured product obtained by curing the epoxy resin composition in the above step (vi). The semiconductor device of the present invention can be obtained, for example, by performing a silicon chip die attach method including the steps (i) to (vi) described above, and performing a resin encapsulation step and the like.

EXAMPLES

The present invention is described below in further detail using a series of examples and comparative examples, but the present invention is in no way limited by these examples.

Synthesis Example 1

Synthesis of Silicone-Modified Epoxy Resin

A flask fitted with a stirring blade, a dropping funnel, a thermometer, an ester adapter and a reflux tube was charged with 149 g of an epoxy resin represented by formula (8) shown below (polystyrene-equivalent weight-average molecular weight: 2,500) and 298 g of toluene, and following azeotropic dehydration for 2 hours at 130° C., the mixture was cooled to 100° C. 1 g of a catalyst (CAT-PL-50PT manufactured by Shin-Etsu Chemical Co., Ltd.) was added dropwise to the flask, a mixture composed of 68 g (0.023 mol) of an organohydrogenpolysiloxane represented by formula (9) shown below and 136 g of toluene was then added dropwise to the flask over a period of 30 minutes, and the resulting mixture was heated at 100° C. for 6 hours. The toluene was then removed from the resulting reaction mixture by distillation under reduced pressure, yielding a silicone-modified epoxy resin represented by formula (10) shown below. The polystyrene-equivalent weight-average molecular weight of the thus obtained silicone-modified epoxy compound was 20,000, and the organopolysiloxane-derived content within the compound was 31.2% by mass.

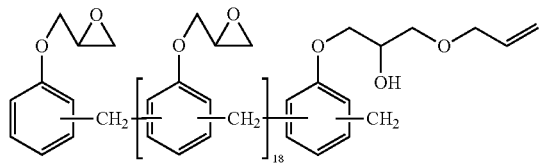

(8)

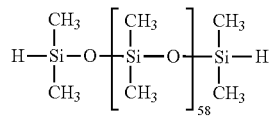

(9)

$$\text{(10)}$$

[Chemical structure diagram showing an epoxy-silicone compound with multiple epoxy groups, benzene rings connected by CH₂ groups (with subscript 18), and a siloxane chain with subscript 58]

Examples 1 to 3, Comparative Examples 1 to 5

Using the various components listed below and the respective amounts shown in Table 1, the components were mixed together using a planetary mixer, were subsequently passed through a triple roll mill, and were then mixed a second time at 25° C. in a planetary mixer, yielding epoxy resin compositions of examples 1 to 3 and comparative examples 1 to 5.

<(A) Epoxy Resin>

(1) Epoxy resin (a1): the silicone-modified epoxy resin produced in synthesis example 1 (epoxy equivalent weight: 291, softening point: 70° C.)

(2) Epoxy resin (a2): an o-cresol novolac epoxy resin (EOCN1020-55, manufactured by Nippon Kayaku Co., Ltd., epoxy equivalent weight: 200, softening point: 57° C.)

(3) Epoxy resin (a3): a bisphenol A epoxy resin (RE310S, manufactured by Nippon Kayaku Co., Ltd., epoxy equivalent weight: 180, liquid (viscosity: 15 Pa·s) at room temperature (25° C.))

<(B) Curing Agent>

(1) Curing agent (b1): an aralkyl phenolic resin (MEHC-7800H, manufactured by Meiwa Plastic Industries, Ltd., phenol equivalent weight: 175, softening point: 85° C.)

(2) Curing agent (b2): a diaryl bisphenol A (BPA-CA, manufactured by Konishi Chemical Industry Co., Ltd., phenol equivalent weight: 154, liquid (viscosity: 16 Pa·s) at room temperature (25° C.))

<(C) Curing Accelerator>

2-phenyl-4-methyl-5-hydroxymethylimidazole (2P4MHZ-PW, manufactured by Shikoku Corporation)

<(D) Inorganic Filler>

Silica (SE-2030, spherical, mass-average particle size: 0.6 μm, manufactured by Admatechs Co., Ltd.)

<(E) Diluent>

Carbitol acetate, boiling point: 217.4° C.

<(F) Dimethyl Silicone>

KF-96-100cs (manufactured by Shin-Etsu Chemical Co., Ltd., molecular weight: 6,000, viscosity at 25° C.: 97 mPa·s)

<Other Component: Silane Coupling Agent>

γ-glycidoxypropyltrimethoxysilane (product name: KBM403, manufactured by Shin-Etsu Chemical Co., Ltd.)

Each of the epoxy resin compositions was subjected to the evaluation tests described below. The results are shown in Table 1.

<Viscosity>

The viscosity of each composition was measured in accordance with JIS Z-8803, using an E-type viscometer (HBDV-III, manufactured by Brookfield Engineering Labs, Inc.), under conditions including a measurement temperature of 25° C. and a shear rate of 2.00 (sec$^{-1}$), with the measurement being performed 2 minutes after starting rotation.

<Viscosity of B-Stage State at 120° C.>

Each of the epoxy resin compositions was B-staged at 120° C. for 15 minutes, and the viscosity of the resulting B-stage state was measured under the same conditions as described above (but with the measurement temperature changed to 120° C.).

<Residual Voids Following Screen Printing>

Using each composition, screen printing was performed onto one side of a silicon wafer (diameter: 6 inches, thickness: 0.2 mm), using a #325 screen mask having an opening of 140 mm in diameter and a thickness of 50 μm, and under conditions including a print pressure of 10 psi and a urethane squeegee speed of 25 mm/s, thereby applying a thin coating film of the epoxy resin composition across the entire surface of the wafer. The level of voids within the coating film was evaluated immediately following application, and then again after standing for 30 minutes in an atmosphere at 25° C. and 50% RH, using the criteria shown below.

++10 or fewer voids
+11 to 50 voids
−51 or more voids

<Arithmetic Mean Roughness of Surface Following B-Staging>

Each of the epoxy resin compositions applied to a silicon wafer in the manner described above was B-staged by heating at 120° C. for 15 minutes under a stream of nitrogen, yielding a silicon wafer with a coating film of the B-staged epoxy resin composition thereon. The arithmetic mean roughness of the surface of the B-stage state epoxy resin composition was measured in accordance with JIS B 0601 using a laser microscope (model number: VK-8510, manufactured by Keyence Corporation).

<Dicing Properties>

Each of the silicon wafers obtained above was bonded to a dicing tape (T-80MW, manufactured by Toyo Adtec Co., Ltd.) via the B-staged epoxy resin composition, and the dicing properties were then evaluated by dicing the wafer into individual chips of dimensions 5 mm×5 mm at a dicing speed of 50 mm/s. If neither chip flying nor chip breakage occurred, the dicing properties were evaluated as good (+), whereas if at least one of chip flying or chip breakage occurred for one or more of the individual chips, the dicing properties were evaluated as poor (−).

<Die Attach Properties>

Each cut individual chip comprising a portion of the silicon wafer and the epoxy resin composition was picked up from the dicing tape, and die-attached via the epoxy resin composition to a BT circuit board (thickness: 200 microns, 35 mm×35 mm) having a solder resist (thickness: 30 microns) on the surface thereof. The conditions during die attachment included a pressure of 2 MPa, a bonding time of 0.5 seconds, and a temperature for both the chip and the circuit board of 150° C. The epoxy resin composition on the BT circuit board was then cured by heating at 125° C. for one hour, and then at 165° C. for a further two hours. The thus obtained device was inspected for the existence of voids and peeling using an ultrasonic defect detection apparatus (model number: Quantum 350, manufactured by Sonix, Inc.). Chips for which those regions in which at least one of peeling or voids was detected represented 5% or more of the chip surface area were deemed to have poor die attach properties (−), whereas chips in which these regions represented less than 5% of the surface area were deemed to have good die attach properties (+).

<Young's Modulus>

The dynamic viscoelasticity was measured for a cured test piece having dimensions of 20 mm×5 mm×200 μm. A dynamic viscoelasticity measurement device was used for the measurement, and the Young's modulus at 25° C. was measured using the tensile mode, under conditions including a chuck-to-chuck distance of 15 mm and a measurement frequency of 30 Hz.

<Moisture and Solder Resistance Test>

The device prepared above for evaluating the die attach properties was encapsulated using a resin KMC-2520 (an epoxy encapsulating resin, manufactured by Shin-Etsu Chemical Co., Ltd.). The molding conditions included a die temperature of 175° C., an injection time of 10 seconds, an injection pressure of 70 kPa, and a molding time of 90 seconds. Post-curing was conducted at 180° C. for 2 hours. The dimensions of the overall test piece following molding were 35 mm×35 mm×thickness: 1,000 microns.

The thus obtained test piece was left to stand for 168 hours in a thermo-hygrostatic chamber at 85° C. and 85% RH, and was then passed three times through an IR reflow oven at a maximum temperature of 260° C. An ultrasonic defect detection apparatus was used to identify defective test pieces for which those regions in which defects such as peeling or Si chip cracking existed represented 20% or more of the chip surface area, and the number of these defective test pieces was counted relative to the total number of test pieces (20).

<Temperature Cycling Test>

Following the above moisture and solder resistance test, the non-defective test pieces were placed in a temperature cycling tester. The test conditions involved performing 1,000 cycles of a temperature cycle, with one cycle consisting of −55° C./30 minutes, (−55° C.→125° C.)/5 minutes, 125° C./30 minutes, and (125° C.→−55° C.)/5 minutes. Following the 1,000 cycles, the test pieces were inspected for defects such as peeling and cracking using an ultrasonic defect detection apparatus, and the number of defective test pieces was counted relative to the total number of test pieces. In the above description, for example, "(−55° C.→125° C.)/5 minutes" means that the temperature was changed in a linear manner from −55° C. to 125° C. over a period of 5 minutes.

TABLE 1

| | Composition (parts by mass) | Example | | | Comparative example | | | | |
|---|---|---|---|---|---|---|---|---|---|
| | | 1 | 2 | 3 | 1 | 2 | 3 | 4 | 5 |
| A | Epoxy resin (a1) | 61.7 | 28.4 | 28.4 | 28.4 | 28.4 | | 64.6 | |
| | Epoxy resin (a2) | | 28.4 | 28.4 | 28.4 | 28.4 | 52.9 | | |
| | Epoxy resin (a3) | | | | | | | | 53.2 |
| B | Curing agent (b1) | 37.1 | 42.0 | 42.0 | 42.0 | 42.0 | 64.1 | | |
| | Curing agent (b2) | | | | | | | 34.2 | 45.6 |
| C | Curing accelerator | 0.2 | 0.2 | 0.2 | 0.2 | 0.2 | 0.2 | 0.2 | 0.2 |
| D | Inorganic filler | 20.0 | 20.0 | 20.0 | 20.0 | 20.0 | 20.0 | 20.0 | 20.0 |
| E | Diluent | 40.0 | 40.0 | 40.0 | 40.0 | 40.0 | 40.0 | 40.0 | 10.0 |
| F | Dimethyl silicone | 0.3 | 0.3 | 0.05 | 0.005 | | 0.3 | 0.3 | 0.3 |
| Other components | KBM403 | 1.0 | 1.0 | 1.0 | 1.0 | 1.0 | 1.0 | 1.0 | 1.0 |
| Evaluation results | Viscosity (Pa · s) | 40 | 30 | 30 | 30 | 30 | 25 | 15 | 15 |
| | B-stage viscosity at 120° C. (Pa · s) | 85 | 35 | 35 | 35 | 35 | 18 | 56 | 12 |
| | Voids immediately after printing | ++ | ++ | + | − | − | ++ | ++ | ++ |
| | Voids 30 minutes after printing | ++ | ++ | ++ | + | − | ++ | ++ | ++ |
| | Arithmetic mean roughness of surface after B-staging (μm) | 0.3 | 0.4 | 0.4 | 2.1 | 3.6 | 0.5 | 0.3 | No B-stage |
| | Dicing properties | + | + | + | + | − | + | − | Evaluation impossible |
| | Die attach properties | + | + | + | − | Evaluation impossible | + | Pickup impossible | Evaluation impossible |
| | Young's modulus | 1.7 | 2.5 | 2.5 | 2.5 | 2.5 | 4.6 | 2.6 | 4.2 |
| | Moisture and solder resistance test | 0/20 | 0/20 | 0/20 | 5/20 | Evaluation impossible | 7/20 | Evaluation impossible | Evaluation impossible |
| | Temperature cycling test | 0/20 | /020 | /020 | 12/15 | Evaluation impossible | 13/13 | Evaluation impossible | Evaluation impossible |

From the results in Table 1 it is evident that the resin compositions of the present invention exhibit excellent screen printability and superior smoothness following B-staging, and as a result, the dicing properties following bonding to a dicing tape and the die attach properties are excellent, and a cured product can be obtained that exhibits low elasticity in a C-stage state, as well as excellent moisture and solder resistance and superior resistance to temperature cycling.

The compositions of comparative examples 1 and 2, which have reduced amounts of the dimethyl silicone, exhibit poor antifoaming properties following screen printing, and the surface smoothness following B-staging is also poor. As a result, voids tend to be incorporated during die attachment, and spaces tend to form upon bonding to the dicing tape, leading to chip flying during dicing. When voids are incorporated during die attachment, the internal pressure inside the voids tends to increase during the moisture and solder resistance test and the temperature cycling test, causing peeling and chip cracking.

With the composition of comparative example 3, which contains no silicone-modified resin, the Young's modulus of the cured product increased significantly, causing peeling and cracking during the moisture and solder resistance test and the temperature cycling test.

The composition of comparative example 4, which used a liquid curing agent, retains some tack following B-staging, and during dicing, the cutting pressure tends to cause die movement and chip flying. Further, because the composition retains tack, pickup from the dicing tape proved impossible. The composition of comparative example 5, which used a liquid epoxy resin and a liquid curing agent did not undergo B-staging, meaning evaluations of the dicing properties and die attach properties were impossible.

The epoxy resin composition of the present invention can be screen printed onto a wafer, undergoes defoaming rapidly following printing, yields rapid leveling of the remains of the screen mesh and is able to be B-staged, and therefore exhibits excellent bonding to dicing tapes and superior dicing properties when dicing the silicon wafer to form individual chips, meaning the composition is very useful as an epoxy resin adhesive for use in the production of semiconductor devices that require reductions in size, increases in packing density, and increasingly complex structures.

What is claimed is:

1. An epoxy resin composition comprising:
   (A) an epoxy resin that is solid at room temperature and has a softening point of not less than 40° C. and not more than 110° C.,
   (B) a curing agent that is solid at room temperature and has a softening point of not less than 40° C. and not more than 110° C.,
   in an amount that provides, within the component (B), 0.8 to 1.25 equivalents of groups that exhibit reactivity with an epoxy group, per 1 equivalent of epoxy groups within the component (A),
   (C) a curing accelerator,
   in an amount of 0.05 to 10 parts by mass per 100 parts by mass of a combination of the component (A) and the component (B),
   (D) an inorganic filler having a mass-average particle size of 0.05 to 5 μm,
   in an amount of 5 to 200 parts by mass per 100 parts by mass of a combination of the component (A) and the component (B),
   (E) a diluent,
   in an amount of 5 to 400 parts by mass per 100 parts by mass of a combination of the component (A) and the component (B), and
   (F) a dimethyl silicone represented by general formula (I) shown below,
   in an amount of 0.01 to 2 parts by mass per 100 parts by mass of a combination of the component (A) and the component (B):

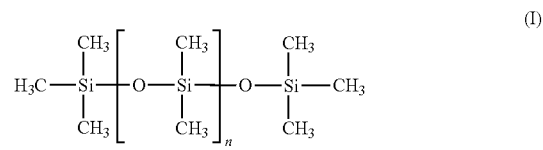

wherein n represents an integer of 0 to 2,000,
wherein at least one of the component (A) and the component (B) is silicone-modified.

2. The epoxy resin composition according to claim 1, wherein
   (1) at one thickness within a range from 5 μm to 200 μm, the composition can be B-staged by heating at 60° C. to 200° C. for a period of 1 minute to 3 hours, and
   (2) in a B-stage state, the arithmetic mean roughness of a surface of the epoxy resin composition is not more than 2 μm.

3. The epoxy resin composition according to claim 1, wherein the diluent (E) is a solvent having a boiling point of 150° C. or higher.

4. The epoxy resin composition according to claim 1, wherein a viscosity of the composition in a B-stage state, measured at 120° C. using an E-type viscometer, is within a range from 1 to 1,000 Pa·s.

5. The epoxy resin composition according to claim 1, wherein the component (A) is at least one epoxy resin selected from the group consisting of novolac epoxy resins, bisphenol epoxy resins, biphenyl epoxy resins, phenol aralkyl epoxy resins, dicyclopentadiene epoxy resins, naphthalene epoxy resins, amino group-containing epoxy resins and silicone-modified epoxy resins.

6. The epoxy resin composition according to claim 5, wherein the silicone-modified epoxy resin is a copolymer obtained by reacting an alkenyl group-containing epoxy resin and an organohydrogenpolysiloxane.

7. The epoxy resin composition according to claim 6, wherein the alkenyl group-containing epoxy resin is at least one of compounds represented by formulas (1) to (3) shown below, and the organohydrogenpolysiloxane is a compound represented by an average composition formula (4) shown below:

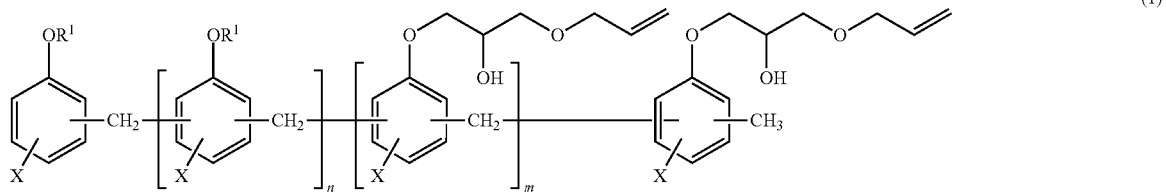

-continued (2)

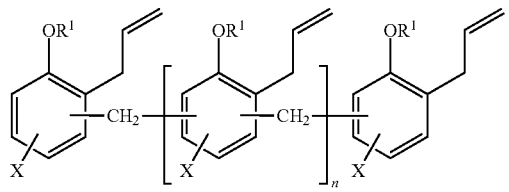

(3)

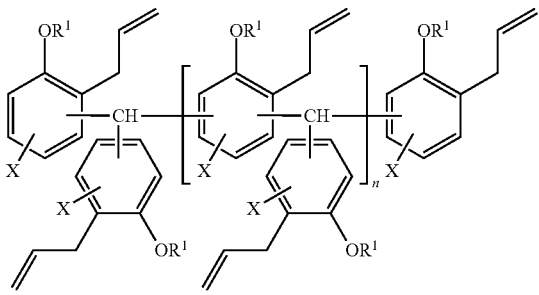

wherein $R^1$ represents a glycidyl group represented by a formula shown below:

each X independently represents a hydrogen atom or a bromine atom, n represents an integer of 0 or greater, and m represents an integer of 1 or greater, provided that m/(m+n) is within a range from 0.01 to 0.5, $$H_a(R^2)_b SiO_{(4-a-b)/2} \quad (4)$$

wherein each $R^2$ independently represents a hydroxyl group, an unsubstituted or substituted monovalent hydrocarbon group of 1 to 10 carbon atoms, an unsubstituted or substituted alkoxy group of 1 to 10 carbon atoms, or an unsubstituted or substituted alkenyloxy group of 1 to 10 carbon atoms, and a and b are numbers that satisfy $0.001 \leq a \leq 1$, $1 \leq b \leq 3$ and $1 < a+b \leq 4$.

8. The epoxy resin composition according to claim 1, wherein the component (B) is at least one curing agent selected from the group consisting of phenolic resins, silicone-modified phenolic resins, acid anhydrides and amines.

9. The epoxy resin composition according to claim 8, wherein the phenolic resin is at least one phenolic resin selected from the group consisting of aralkyl phenolic resins, novolac phenolic resins, bisphenol phenolic resins, trishydroxyphenylmethane phenolic resins, naphthalene phenolic resins, cyclopentadiene phenolic resins, and phenol aralkyl phenolic resins.

10. The epoxy resin composition according to claim 8, wherein the silicone-modified phenolic resin is a copolymer obtained by reacting an organohydrogenpolysiloxane and an alkenyl group-containing phenolic resin.

11. The epoxy resin composition according to claim 10, wherein the organohydrogenpolysiloxane is a compound represented by an average composition formula (4) shown below, and the alkenyl group-containing phenolic resin is at least one of compounds represented by formulas (A) to (C) shown below:

$$H_a(R^2)_b SiO_{(4-a-b)/2} \quad (4)$$

wherein each $R^2$ independently represents a hydroxyl group, an unsubstituted or substituted monovalent hydrocarbon group of 1 to 10 carbon atoms, an unsubstituted or substituted alkoxy group of 1 to 10 carbon atoms, or an unsubstituted or substituted alkenyloxy group of 1 to 10 carbon atoms, and a and b are numbers that satisfy $0.001 \leq a \leq 1$, $1 \leq b \leq 3$ and $1 < a+b \leq 4$,

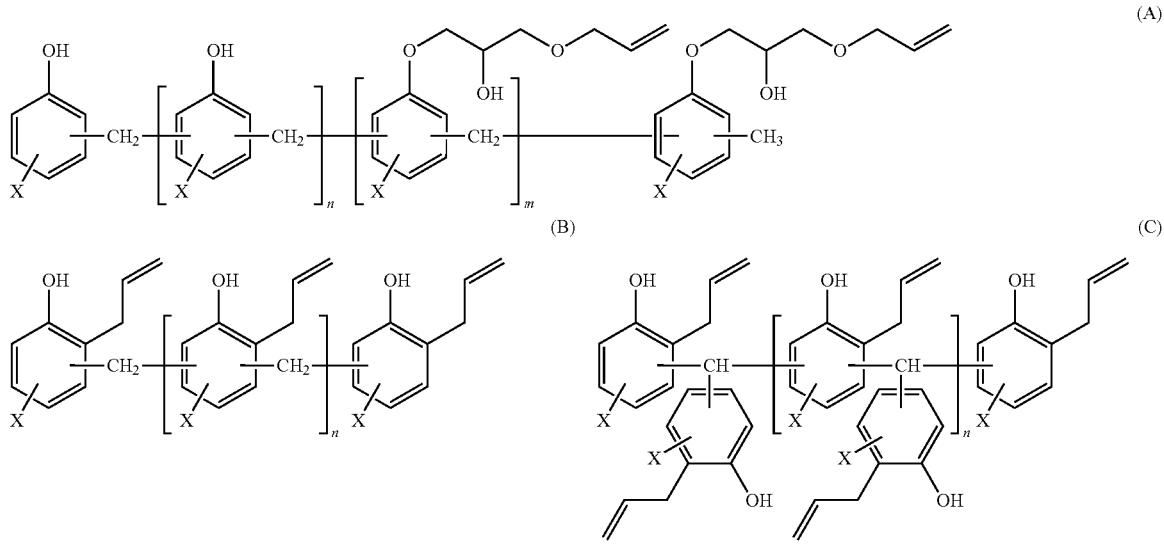

wherein each X independently represents a hydrogen atom or a bromine atom, n represents an integer of 0 or greater, and m represents an integer of 1 or greater, provided that m/(m+n) is within a range from 0.01 to 0.5.

12. A silicon chip die attach method, comprising steps (i) to (vi) below:
- (i) applying the epoxy resin composition defined in claim 1 to one surface of a silicon wafer to form an adhesive layer comprising the epoxy resin composition,
- (ii) performing heating at 60° C. to 200° C. for a period of 1 minute to 3 hours, thereby B-staging the epoxy resin composition within the adhesive layer,
- (iii) bonding the silicon wafer to a dicing tape via the adhesive layer comprising the B-staged epoxy resin composition,
- (iv) cutting the adhesive layer and the silicon wafer of step (iii), thereby obtaining a plurality of individual chips, each comprising a cut adhesive layer and a silicon chip formed from the cut silicon wafer, and having the adhesive layer bonded to one surface of the silicon chip,
- (v) picking up the individual chip from the dicing tape, and mounting the individual chip to a substrate via the epoxy resin composition of the individual chip, and
- (vi) curing the epoxy resin composition of the individual chip mounted on the substrate.

13. A semiconductor device comprising a silicon chip, a substrate and a cured product of the epoxy resin composition defined in claim 1, wherein the silicon chip is bonded to the substrate via the cured product.

* * * * *